United States Patent [19]

Simmen

[11] 4,223,265
[45] Sep. 16, 1980

[54] HIGH-IMPEDANCE AND WIDE-BAND VOLTAGE PROBE FOR THE SELECTIVE MEASUREMENT OF INTERFERENCE VOLTAGES

[75] Inventor: Eugene Simmen, Nussbaumen, Switzerland

[73] Assignee: BBC Brown, Boveri & Company, Limited, Baden, Switzerland

[21] Appl. No.: 933,652

[22] Filed: Aug. 15, 1978

Related U.S. Application Data

[63] Continuation of Ser. No. 770,078, Feb. 18, 1977, abandoned.

[30] Foreign Application Priority Data

Mar. 15, 1976 [CH] Switzerland .................. 3166/76

[51] Int. Cl.$^2$ .................. G01R 1/20; G01R 15/00
[52] U.S. Cl. .................. 324/127; 324/128
[58] Field of Search .................. 324/127, 51, 95, 128; 333/6, 25, 100

[56] References Cited

FOREIGN PATENT DOCUMENTS 47457 2/1930 Norway .................. 324/51

Primary Examiner—Ernest F. Karlsen
Attorney, Agent, or Firm—Orville N. Greene; Frank L. Durr

[57] ABSTRACT

A probe adapted for selectively measuring either symmetrical or asymmetrical interference voltages or interference voltages between terminal and ground and utilizing first and second transformers having interconnected primary windings and tightly magnetically coupled secondary windings connectible with the interference measuring set for optionally measuring either symmetrical or asymmetrical voltages or voltages against ground, is disclosed. When measuring a balanced (symmetrical) voltage the terminals of the first transformer primary winding are coupled to the opposite poles of the specimen under test. When measuring an unbalanced (asymmetrical) voltage or a voltage with respect to ground, both terminals of the first transformer winding are connected in common to the pole of the specimen under test. In an cases a single ground terminal of the probe is connected to the ground of the specimen under test.

Measurements of the symmetrical and asymmetrical interference voltages may be taken without removing the probe from the specimen under test by simply connecting the cable from the measuring set to the connectors "sym" or "asym" respectively and by reconnecting the probe to the specimen under test in the manner described above. The circuits under test need not be removed from their operating environment.

The circuit design of the probe permits the conditions for symmetry to be easily and redialy established.

10 Claims, 1 Drawing Figure

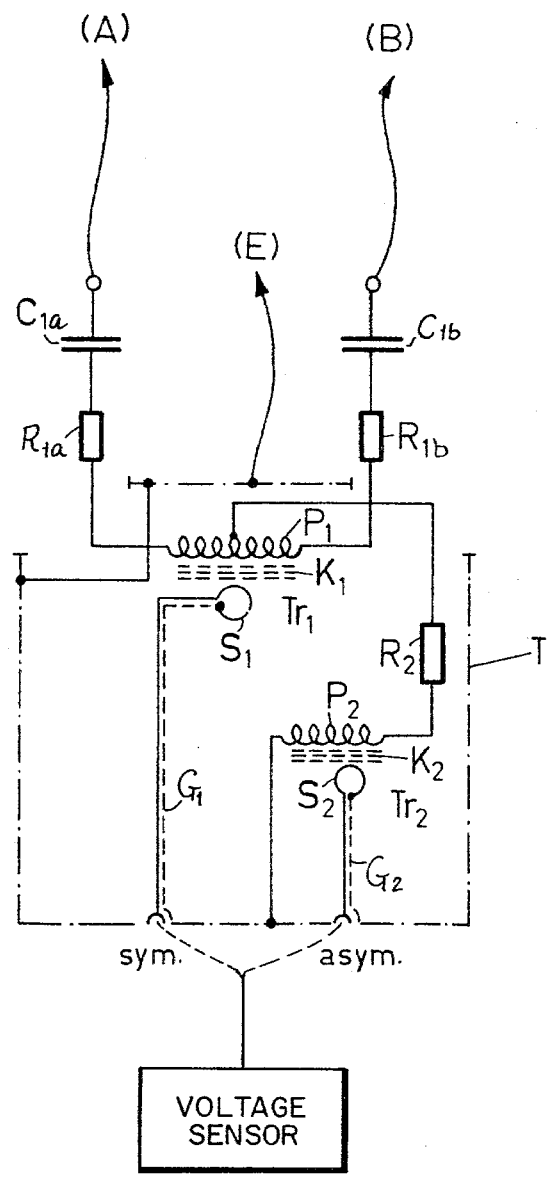

HIGH-IMPEDANCE AND WIDE-BAND VOLTAGE PROBE FOR THE SELECTIVE MEASUREMENT OF INTERFERENCE VOLTAGES

RELATED APPLICATIONS

This is a continuation of U.S. Pat. No. 770,078, filed Feb. 18, 1977 now abandoned.

BACKGROUND OF THE INVENTION

The invention relates to a high-impedance and wide-band voltage probe for the measurement of balanced or unbalanced interference voltages or interference voltages occurring between each terminal and ground of electrical or electronic systems connected to single-phase a.c. or d.c. sources.

The need for separate measurement of the unbalanced and balanced interference voltages of electronic apparatus and/or systems had already been recognized since the development of interference suppression techniques.

The solutions proposed by "Comite International Special des Perturbations Radioelectriques" (CISPR) are intended for the measurement of such voltages using mains simulation under precisely defined conditions (impedance of the mains) and are confined to apparatus with a maximum current consumption of 16 Amps. A high-impedance interference voltage voltmeter was initially used but in the course of time mains simulations were adapted to low-impedance measuring apparatus.

Measurement of interference voltages on apparatus and systems with a greater power and under operating conditions led to increased difficulties and the CISPR limited itself to measurement of interference voltages relative to ground (earth). A voltage probe with an impedance of 1500 Ohms between the measuring point and ground is universally employed at the present time. The limit values of the interference voltages are also referred to ground.

In connection with interference suppression work on trolleybuses, the relevant organizations of the Swiss Postal Telephone and Telegraph Administration developed a measuring method for defining the unbalanced interference voltages by the use of the resonant circuits. The disadvantage of this method is the necessity for tuning the circuits and the accompanying possible lack of symmetry.

It is frequently the case, for example, in interference suppression work, that measurement of the unbalanced or balanced interference voltages is desirable in systems under operating conditions and in some circumstances even necessary; this can apply to the optimum design of interference suppression means, taking into account protection against electric shock. Such measurement is possible only to a limited extent when using the above-mentioned mains simulations; on the one hand, the mains current is limited to 16 Amps and on the other hand it is not possible to measure objects which are driven through current-adjusting means.

OBJECT AND BRIEF DESCRIPTION OF THE INVENTION

It is an object of the invention to avoid the disadvantages of known solutions to the problem. According to the invention, this is achieved by the embodiment of a high-impedance and wide-band voltage probe of the initially -mentioned kind incorporating two transformers, each having an annular ferrite core, the primary winding of the first transformer being connected to either one or both of the terminals of the specimen under test and the primary winding of the second transformer being connected between ground and the centre tap of the primary winding of the first transformer so that, depending on whether a balanced or unbalanced interference voltage occurs on the terminals of the specimens or between each terminal and ground, a voltage appears on the secondary winding of either the first transformer or the second transformer and said voltage is supplied through corresponding RF cables to a measuring apparatus where it is measured.

BRIEF DESCRIPTION OF THE FIGURE

The sole FIGURE shows a schematic diagram of a probe designed in accordance with the principles of the present invention.

DETAILED DESCRIPTION OF THE INVENTION

The invention will be explained by reference to the accompanying drawing. The first transformer $Tr_1$ includes having a primary winding $P_1$, a core $K_1$ and a secondary winding $S_1$. The primary winding $P_1$ is connected through two isolating capacitors $C_{1a}$ and $C_{1b}$ in series with two resistances $R_{1a}$ and $R_{1b}$ to the terminals A, B of the specimen under test. The second transformer $Tr_2$ includes a primary winding $P_2$ core $K_2$ and secondary winding $S_2$. Its a primary winding $P_2$ is connected between ground (E) and the centre tap of the primary winding $P_1$ of the first transformer $Tr_1$ through resistance $R_2$. The secondary windings $S_1$ and $S_2$ are respectively connected to coaxial cables $G_1$ and $G_2$. The solid line represents the center conductor while the dotted line represents the conductive shield surrounding the center conductor and connecting one terminal of the winding to ground.

Measurement of Balanced Voltages

If a purely balanced voltage (push-pull voltage, with both poles of the voltage being of equal magnitude and opposite phase) is connected to the opposite terminals of the first transformer $P_1$, the a.c. voltage applied to the primary winding $P_2$ of the second transformer will be equal to zero if it is assumed that both halves of the primary winding $P_1$ of the first transformer $Tr_1$ are electrically identical. The condition thus set for symmetry of the primary winding $P_1$ can be easily satisfied for frequencies in which the internal and stray capacitances of the winding do not play an important part. A deterioration must be expected only in the MHz range but this nevertheless permits the use of the probe to approximately 10 MHz.

A voltage which is supplied through an RF Cable to the measuring apparatus (at A and B) appears on the secondary terminals $S_1$ of the first transformer $Tr_1$ and, by using a correcting factor, enables the balanced voltage to be defined. No voltage on the other hand appears at the secondary terminals $S_2$ of the second transformer $Tr_2$ if the voltage caused by lack of symmetry in the primary $P_1$ is disregarded.

Measurement of Unbalanced Voltages

If an unbalanced voltage is applied to the probe (in phase, one pole of the interference voltage is applied to both specimen terminals A and B, the second pole being connected to ground) the magnetic flux in one half of the first transformer $Tr_1$ compensates for the magnetic flux in the other half of the said transformer (assuming very close coupling by the ferrite core $K_1$) so that the impedance introduced by the first transformer $Tr_1$ into the circuit of the unbalanced voltage is very low. Practically the full unbalanced voltage therefore appears on the second transformer $Tr_2$ and is measured by means of its secondary winding $S_2$ and RF cables. No voltage will appear on the secondary winding $S_1$ of the first transformer $Tr_1$ apart from the voltage produced by lack of symmetry in the primary winding $P_1$. The magnitudes of the currents are very low due to the high impedance of the primary windings $P_1$, $P_2$ of both transformers $Tr_1$, $Tr_2$. There is no core saturation so that both components are measured separately when a voltage is applied which consists of both balanced and unbalanced components.

Measurement of Voltage With Respect to Ground

Measurement of a voltage with respect to ground is performed in the same way as measurement of an unbalanced voltage. In this case both terminals of the probe are connected to each other and to the terminal under investigation.

Protective resistors $R_{1a}$ and $R_{1b}$ are connected between the isolating capacitors $C_{1a}$ and $C_{1b}$ and the corresponding ends of the primary winding $P_1$; they can have a value of 470 Ohms and a power rating of 1 Watt. A further resistor $R_2$ is also provided between the centre tap of the primary winding $P_1$ and the non-earth end of the primary winding $P_2$; an advantageous value of this resistor is 1 Kohm with a power rating of 1 Watt. Partial screening T, connected to ground (E), is also provided for the transformers $Tr_1$ and $Tr_2$.

Small dimensions and d.c. isolation by the transformers, so that the measuring circuit is decoupled from the power part and protected against the latter, are features which can be mentioned as special advantages of the voltage probe.

The technological applications of the probe include interference suppression operations which enable the interference suppression means to be designed under optimum conditions taking into account the special method by which the two interference voltages—the balanced and unbalanced voltages—are produced. When used in conjunction with current probes the probe facilitates determination of the balanced and unbalanced components of interference source load impedances (for example, supply networks).

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. A voltage probe capable of measuring the balanced and unbalanced components of an interference voltage generated by a specimen under test, said specimen having first and second terminals, said probe comprising:
   (A) a first transformer ($Tr_1$) including only one primary winding ($P_1$) and only one secondary winding ($S_1$), said first transformer primary winding having opposite end terminals and a center tap;
   (B) a second transformer ($Tr_2$) including only one primary winding ($P_2$) and only one secondary winding ($S_2$), said second transformer primary winding ($P_2$) having opposite end terminals, one of said end terminals of said second transformer primary winding ($P_2$) being connected to said first transformer primary winding ($P_1$) center tap, the remaining said end terminal of said second transformer primary winding ($P_2$) being coupled to ground;
   (C) first connector means adapted to couple, at the option of the operator of said probe, one of said end terminals of said first transformer primary winding ($P_1$) to either of said first and second terminals of said specimen under test; and
   (D) second connector means adapted to couple, at the option of the operator of said probe, the remaining of said end terminals of said first transformer primary winding ($P_1$) to either of said first and second terminals of said specimen under test, whereby:
      (1) when said first and second connector means are each coupled to respective opposite terminals of said specimen under test, a voltage proportional to the balanced component of said interference voltage appears across said first transformer secondary winding ($S_1$); and
      (2) when said first and second connector means are both coupled to one another and to one of said terminals of said specimen under test and the remaining said terminal of said specimen under test is grounded, a voltage proportional to said unbalanced component of said interference voltage appears across said second transformer secondary winding ($S_2$).

2. The voltage probe of claim 1, wherein each of said secondary windings ($S_1$, $S_2$) of said two transformers ($Tr_1$, $Tr_2$) consists of only a single twin winding.

3. A voltage probe according to claim 1, further including screening (T) at least partially surrounding said transformers ($Tr_1$, $Tr_2$) to reduce the effect of RF type interference upon the measurements being taken.

4. A voltage probe according to claim 1, further including means for measuring the magnitude of the induced voltage appearing across said first secondary winding.

5. A voltage probe according to claim 1, further including means for measuring the magnitude of the induced voltage appearing across said secondary winding.

6. The voltage probe of claim 1, wherein said specimen under test is an electrical system connected to either a single phase A.C. source or a D.C. source and wherein said probe is capable of measuring said balanced and unbalanced components while said electrical system is connected to either said single phase A.C. or said D.C. source.

7. A voltage probe according to claim 1, wherein each of said connector means includes an isolating capacitor.

8. A voltage probe according to claim 7, wherein each of said connector means further includes a resistor of low ohmic value connected in series with said isolating capacitor, said resistor and said capacitor of each said connector means defining a filter circuit which permits passage of said interference voltages but filters out power source voltages applied to said specimen under test.

9. A method for measuring the balanced component of an interference voltage generated by a specimen under test, said specimen having first and second opposite terminals, said method comprising the steps of:

providing a voltage probe comprising: a first transformer including a primary winding and a secondary winding, said first transformer primary winding having opposite end terminals and a center tap; a second transformer including a primary winding and a secondary winding, said second transformer primary winding having opposite end terminals, one of said end terminals of said second transformer primary winding being connected to said center tap of said first transformer primary winding, the remaining said end terminal of said second transformer primary winding being coupled to ground;

connecting said end terminals of said first transformer primary winding to respective opposite terminals of said specimen under test; and measuring a voltage, representative of said balanced component of said interference voltage, appearing across said first transformer secondary winding.

10. A method for measuring the unbalanced component of an interference voltage generated by a specimen under test, said specimen having first and second opposite terminals, said method comprising the steps of:

providing a voltage probe comprising: a first transformer including a primary winding and a secondary winding, said first transformer primary winding having opposite end terminals and a center tap; a second transformer including a primary winding and a secondary winding, said second transformer primary winding having opposite end terminals, one of said end terminals of said second transformer primary winding being connected to said center tap of said first transformer primary winding, the remaining said end terminal of said second transformer primary winding being coupled to ground;

connecting both of said end terminals of said first transformer primary winding to each other and to a single one of said terminals of said specimen and connecting the remaining one of said terminals of said specimen to ground;

measuring a voltage, representative of said unbalanced component of said interference voltage, appearing across said second transformer secondary winding.

* * * * *